United States Patent [19]

Stillman

[11] Patent Number: 4,754,555
[45] Date of Patent: Jul. 5, 1988

[54] APPARATUS FOR INSPECTING THE COPLANARITY OF LEADED SURFACE MOUNTED ELECTRONIC COMPONENTS

[75] Inventor: Ben S. Stillman, Cupertino, Calif.
[73] Assignee: Adcotech Corporation, Milpitas, Calif.
[21] Appl. No.: 51,889
[22] Filed: May 18, 1987
[51] Int. Cl.⁴ .......................... G01B 7/02; G01B 7/28
[52] U.S. Cl. ........................................ 33/533; 33/552; 33/558
[58] Field of Search ................. 33/533, 549, 552, 555, 33/557, 558; 340/653

[56] References Cited

U.S. PATENT DOCUMENTS

| | | | |
|---|---|---|---|
| 3,895,446 | 7/1975 | Orlov et al. | 33/533 |
| 4,017,978 | 4/1977 | Peruchon et al. | 33/558 |
| 4,221,053 | 9/1980 | Bobel, II et al. | 33/552 |
| 4,233,745 | 11/1980 | Ramon et al. | 33/533 |
| 4,400,884 | 8/1983 | Baresh et al. | 33/552 |

FOREIGN PATENT DOCUMENTS 2854563  6/1980  Fed. Rep. of Germany ........ 33/558

Primary Examiner—Richard R. Stearns
Attorney, Agent, or Firm—Rosenblum, Parish & Bacigalupi

[57] ABSTRACT

Apparatus for inspecting the coplanarity of surface mounted integrated circuit components including a housing for containing necessary electrical circuitry and indicators, a socket assembly for receiving one electronic circuit package at a time and for contacting each lead of the package that is within acceptable coplanarity limits, and means for indicating those leads that are out of predetermined limits. The device also includes a spring loaded plunger assembly for facilitating insertion of a packaged IC device into the inspection socket and for applying appropriate loading force to the top surface thereof.

12 Claims, 4 Drawing Sheets

APPARATUS FOR INSPECTING THE COPLANARITY OF LEADED SURFACE MOUNTED ELECTRONIC COMPONENTS

BACKGROUND OF THE INVENTION

1. Field of the Invention

The present invention relates generally to electronic component inspection apparatus, and more particularly to a device for verifying that the leads on surface mounted electronic components are complanar within established limits.

2. Description of the Prior Art

With the advent of integrated circuit packages having contact legs extending downwardly and either flared outwardly or rolled beneath the package, so that the device can be surface mounted to a printed circuit board by merely soltering the leads to the board contact pads, it became necessary to determine that the contact points of all of the leads were coplanar within established limits, so as to ensure that proper electrical contact was made between the circuit board and all of the leads of the device Packages of the above-referenced to type are variously referred to as plastic leaded chip carriers (PLCC's), small outline IC (SOIC) carriers, gullwing packages J-lead packages, etc.

These devices can be manually inspected by placing the device on a smooth surface and noting any separation between the contact points of any lead and the smooth surface. The devices can also be visually inspected by sighting down the row of contact pins and noting excessive variation. These types of inspection are of course not highly reliable because of the tolerances involved.

Machines have also been developed which perform an automatic optical inspection of the coplanarity of the package leads. However, such machines are typically quite expensive and inconvenient to use at the point of board installation.

SUMMARY OF THE PRESENT INVENTION

Is therefore a primary object of the present invention to provide a highly reliable yet electrically and mechanically simply coplanarity inspection apparatus which is relatively inexpensive and easy to use at any point in an electronic board assembly process.

Another objective of the present invention is to provide a coplanarity testing apparatus which is convenient to use in testing small lots of surface mounted components.

Briefly, a preferred embodiment of the present invention includes a housing for containing necessary electrical circuitry and indicators, a socket assembly for receiving one electronic circuit package at a time and contacting each lead of the package that is within acceptable coplanarity limits, and means for indicating those leads that are out of predetermined limits. The device also includes a spring loaded plunger assembly for facilitating insertion of a packaged IC device into the inspection socket and for applying appropriate loading force to the top surface thereof.

An important advantage of the present invention is that it quickly indicates each and every lead of the device that fails to fall within acceptable coplanarity limits.

Another advantage of the present invention is that it can include a plurality of interchangeable socket assemblies adapted to facilitate the testing of various sizes and types of packaged IC devices.

These and other advantages of the present invention will no doubt become apparent to those of ordinary skill in the art after having read the following detailed description of the preferred embodiments illustrated in the several figures of the drawing.

IN THE DRAWING

DETAILED DESCRIPTION OF THE PREFERRED EMBODIMENTS

Figure 1:
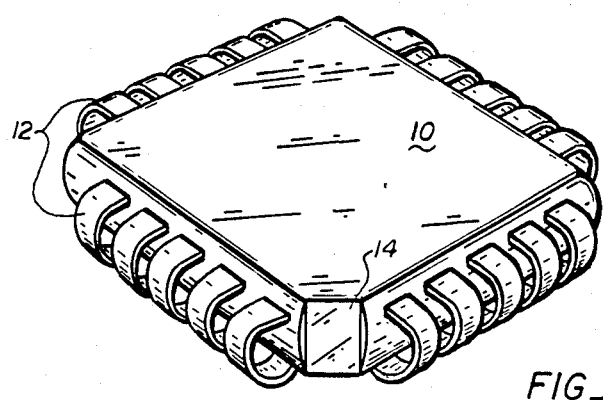
FIG. 1 is a perspective view illustrating one example of the class of IC packages which can be inspected using the present invention.

Referring now to FIG. 1 of the drawing, there is shown for purposes of facilitating an understanding of the present invention, a version of a 20 pin plastic leaded chip carrier (PLCC) device, various views of which will be used in the drawing to illustrate operation of the present invention. It is to be understood however, that the present invention can be adapted to inspect any type of leaded surface mounted I/C package. The illustrated device includes a plastic body 10 housing an integrated circuit chip (not shown) which is electrically connected to a plurality of metallic leads the distal ends of which extend from the four sides of the package, as illustrated as 12, and are curled back beneath the edges of the body 10 to form supporting contact legs for the device. Note that the body 10 has a champfered corner 14 which is used to identify of the various legs 12.

Figure 2:
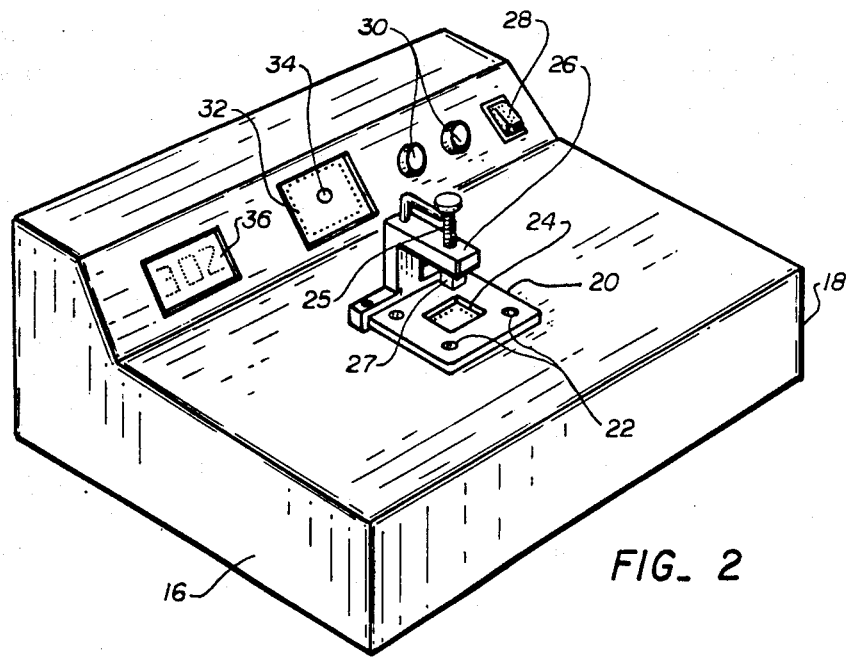
FIG. 2 is a perspective view illustrating a preferred embodiment of a coplanarity inspection device in accordance with the present invention.

In FIG. 2 a preferred embodiment of an apparatus in accordance with the present invention is depicted and includes a generally rectangular housing 16 having a planar upper work surface 18 with a centrally positioned cut-out for receiving a socket assembly 20. As will be further described below, assembly 20 is supported by four pins 22 and includes an IC package receiving cavity or nest 24. Disposed within housing 16 is a motherboard having various electrical and electronic components affixed thereto. Immediately behind assembly 20 is a plunger assembly 26 for use in applying appropriate top loading forces to an IC package when it is disposed within the socket 24 for inspection. Housing 16 has an upstanding rear portion including an on/off switch 28, various selectical control knobs 30, and a lead contact indicator 32 including an accept/reject indicator 34. The device may also include one or more suitable indicators 26.

Figure 3:
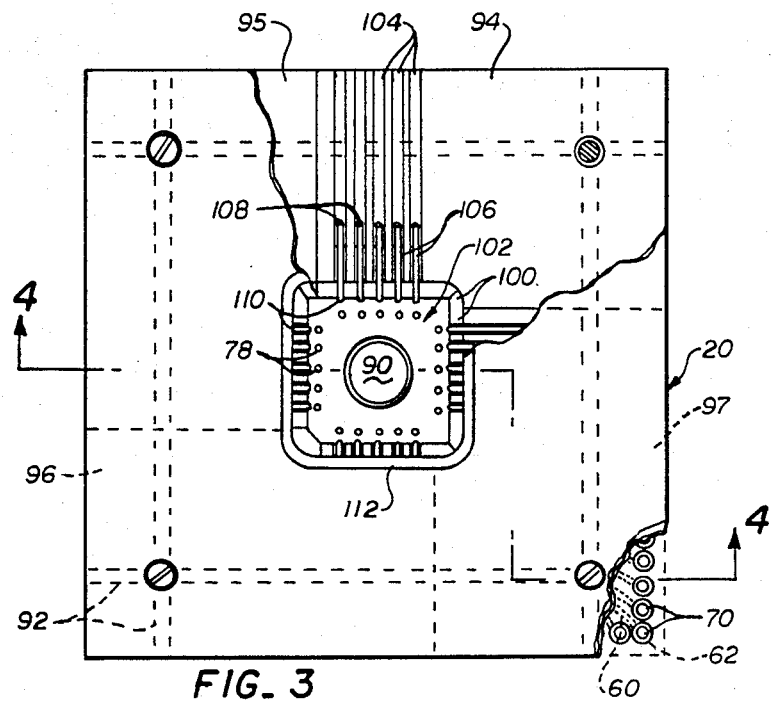
FIG. 3 is a partially broken top plan view illustrating certain details of a socket assembly in accordance with the present invention.
Figure 4:
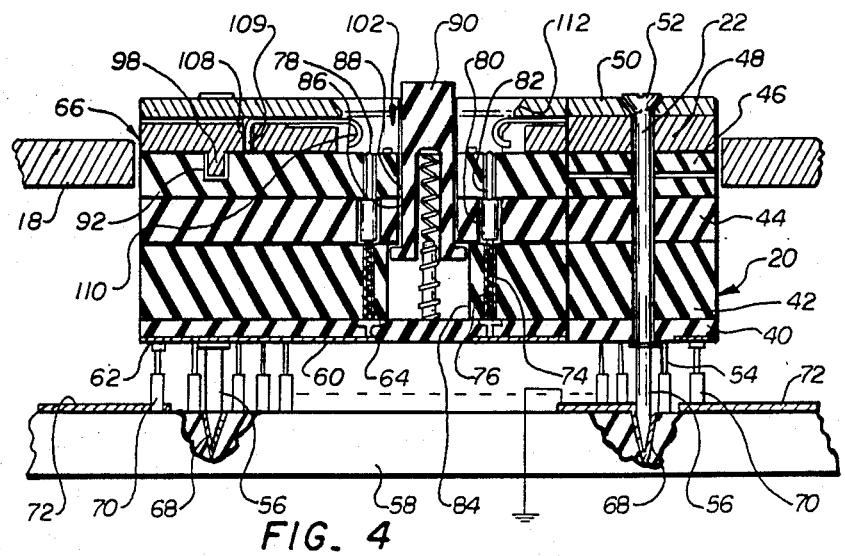
FIG. 4 is a partially broken cross sectional view taken along the line 4—4 of FIG. 3.

In FIGS. 3 and 4, component parts of the socket assembly 20 will be described in detail. Generally speaking, assembly 20 is comprised of a multi-layered stack including a PC board 40, a spring plate 42, a precision plate 44, a pin bearing plate 46, a nest plate 48 and a side contact containment plate 50. Whereas the plates 42, 44, and 46 are made of a suitable insulated material such as anodized aluminum, teflon coated aluminum, alumina quartz or a suitable ceramic, the plates 48 and 50 are normally conductive and fabricated of steel. The assembly is aligned and held in precision contact by means of four pins 22 and screws 52 which cooperate with snap rings 54 to apply suitable clamping forces to the assemblage. The lower extremities 56 of the pins 22 form precision locator and stand-off pins as well as providing grounding contact between the plates 48 and 50 and the ground plane of a printed circuit motherboard 58.

The board 40 is generally referred to as a "personality board" in that it includes a plurality of circuit traces 60 which extend from contact pads 62, occupying various ones of a large number of circuit contact pad locations arrayed around each lower side edge of board 40, to a corresponding number of contact pads and through board contacts 64 (FIG. 4) arrayed about an inner rectangular locus, as will be further described below. As indicated in FIG. 4, when the assembly 20 is inserted through the opening 66 in the upper surface 18 of housing 16, the pins 56 mate with recesses or sockets 68 formed in motherboard 58 and align the assembly so that the contact pads 62 are properly aligned with the upper ends of a plurality of spring loaded pogo pin contactor elements 70 understanding from board 58 and disposed in a rectangular array suited to interconnect the various pads 62 of assembly 20 with the electrical traces 72 of motherboard 58.

Spring plate 42, precision plate 44 and pin bearing plate 46 all include a plurality of aligned bores 74 disposed in rectangular arrays and collectively providing communicating passageways extending upwardly from each of the contact pads 64. Disposed within the bores 74 are springs 76 which bear against the contacts 64 and provide small upwardly biasing forces to the bottom of pins 78 which are diposed within and extend through the bores 80 and 82 in plates 44 and 46 respectively. Details of the pins 78 and their relationship to the plates 44 and 46 will be described below. Also provided in plates 42, 44, and 46, and central to the array formed by bores 74, 80 and 82 are bores 84, 86 and 88 which are adapted to receive a spring loaded elevator pin 90. In the preferred embodiment plate 46 is also provided with four orthgonally disposed slots arranged as illustrated by the dashed lines 92 in FIG. 3.

In accordance with the present invention, nest plate 48 is actually comprised of an assembly of four plate segments 94–97, as illustrated by the like numbered dashed lines in FIG. 3, with each segment including a locator rib 98 adapted to fit within one of the grooves 92. Each of the plates 94–97 includes a beveled inner edge 100 which combine with those of the other segments to form a nest 102 for receiving a PLCC package to be inspected. Each of the plate segments 94–97 is provided with a plurality of grooves 104 which extend inwardly, as illustrated in FIG. 3, and are adapted to receive spring elements 106 having one end 109 turned downwardly to extend into vertical bores 108 formed in the plates 94–97, and an opposite end 110 which is formed to provide a wiping contact for engaging the legs of a PLCC package to be inspected.

The containment plate 50 is also provided with a central opening, the edges of which are beveled as indicated at 112 to provide additional lead surfaces for guiding a PLCC device into the nest 102.

Figure 5:
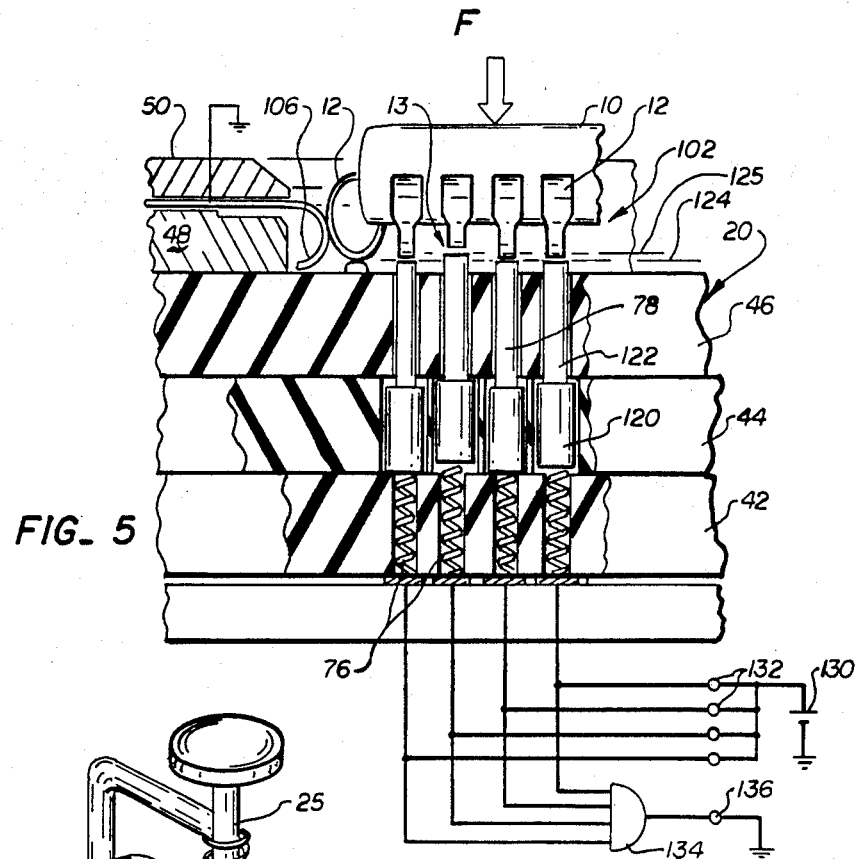
FIG. 5 is a broken partial section of a socket assembly illustrating operation of the present invention.

Turning now to FIG. 5 of the drawing, a portion of the assembly 20 is depicted in broken section to illustrate operation of the present invention. Note that the pins 78 are configured to have a lower barrel portion 122 of a first diameter and an upper portion 122 forming a contact pin and having a diameter of less than that of the barrel portion 120. Note also that the length of the pin portion 122 is slightly longer than the thickness of the plate 46 while the length of the barrel portion 120 is somewhat shorter than the thickness of plate 44. By design, the thicknesses of plates 44 and 46 are carefully selected and controlled, and the lengths of pin portions 120 and 122 are likewise selected and controlled so that when driven into their lower positions bottoming out against the upper surface of plate 42, the upper ends of pins 78 lie precisely within a plane defined by the reference line 124. Note however, that with no downward vertical force applied to the ends of the pins 78, each will extend a predetermined distance above the plane 124, to lie in a second plane represented by the line 125, as the upper ends of the pin portion 120 are driven into engagement with the bottom surface of plate 46 by the springs 76.

Since the travel of the pins 78 is thus limited to a well controllable tolerance defined by the thickness of plate 44 and the length of pin portions 120 it will be appreciated that with a PLCC device 10 positioned within the nest 102, each of the legs 12 thereof will engage the upper ends of one of the pins 78, and in response to the application of a downward force F applied to the top of device 10, will cause each contacted pin to be moved toward the reference plane 124. Should any lead 12 be out of tolerance relative to the other pins, and thus be non-coplanar, as indicated at 13, it will be appreciated that no contact will be made to the pin lying therebeneath. It will thus be appreciated that with an upper portion of each of the legs 12 grounded by virtue of its contact with a grounded wiper 106, and with a voltage applied from a source 130 through individual lamps 132 to the otherwise insulated pins 78, each of the lamps 132 associated with a device leg 12 contacting a pin 78 will be lit, while any leg not contacting a pin 78 will result in the corresponding lamp 132 not being lit. Accordingly, the failure of any light 132 to be lit will indicate the particular device lead that is defective. Furthermore, by coupling each of the pins 78 to suitable logic, as indicated by 134, an accept/reject light 136 can be activated by the failure of any of the legs 12 to make contact with a pin 78. It will therefore be appreciated that through the use of the apparatus described above, a mechanically and electrically simple coplanarity inspection system is provided.

Although it is possible to manually load a PLCC device into the nest 102 for coplanarity inspection by simply placing the device over the nest so that it rests upon the elevator pin 90 (FIG. 4), and then depress the device into the nest using light finger pressure applied to the top thereof, a more reliable procedure requires the provision of a point contact force applicator so that a single loading force F can be applied to the geometric center of the top of the device 10. The application of such a force will ensure that even though the top or bottom surface of the device package might be misleveled relative to the idealized foot or leg contact plane, the device will be caused to assume the proper attitude for coplanarity measurement and the pins 78 will be properly engaged and depressed as depicted in FIG. 5. One such force applying device is illustrated at 26 in FIG. 2 of the drawing, and consists of merely a spring loaded plunger 25 having a head 27 provided with a spring loaded ball contacting element (not shown).

Figure 6:
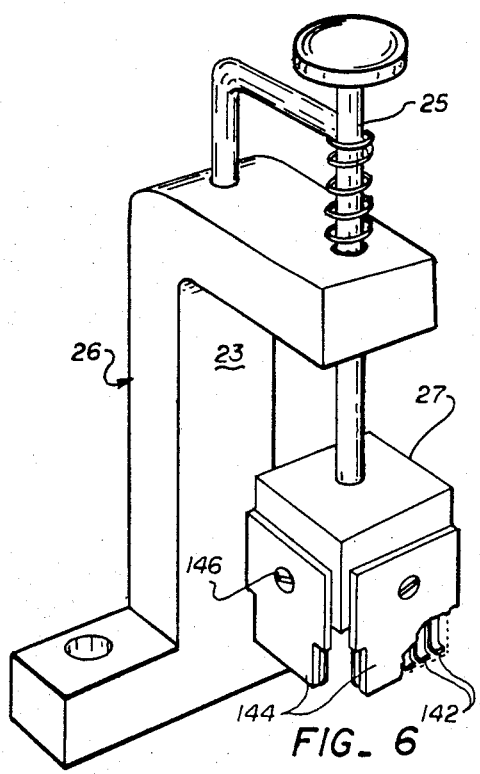
FIG. 6 is a perspective view illustrating a plunger and lead grounding assembly in accordance with the present invention.
Figure 7:
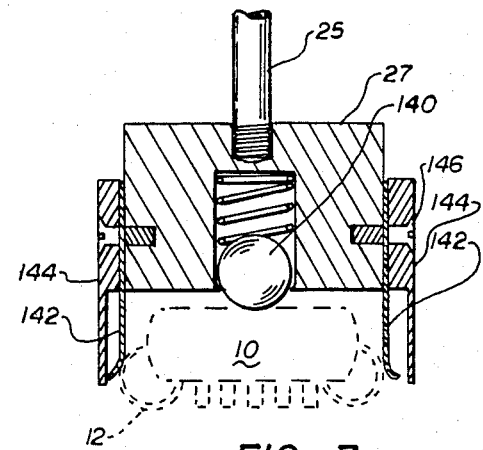
FIG. 7 is a partially broken cross-section taken through of the head of the plunger assembly illustrated in FIG. 6.

An alternative embodiment of the force applicator is depicted in Figs. 6 and 7, and in addition to including a spring loaded plunger 25 and head 27 having a spring loaded ball contactor 140 (FIG. 7), the head also includes means forming a plurality of resilient wiper fingers 142 which are intended engage the upper portions of the legs 12 of a PLCC device or the like, in place of the wipers 110 previously described. Since the fingers 142 are quite delicate, protective external plates 144 are disposed thereover and are secured to the head 27 by means of screws 146 or other suitable fasteners.

It will be appreciated that in an embodiment of the invention including the head configuration depicted in FIGS. 6 and 7, the nest plate 48 can be simplified in that it no longer needs to accommodate wiper pins 106 (FIGS. 3 and 4). Moreover, the nesting opening would be made slightly larger to accommodate the additional width of the fingers 142 and plates 144. In this embodiment, the fingers 142 the connected to device ground by virtue of its physical connection to the metallic elements forming the head 27, plunger 25, and supporting standoff bracket 23 which is mounted either directly to the device chassis, or to the top of the assembly 20.

Figure 8:
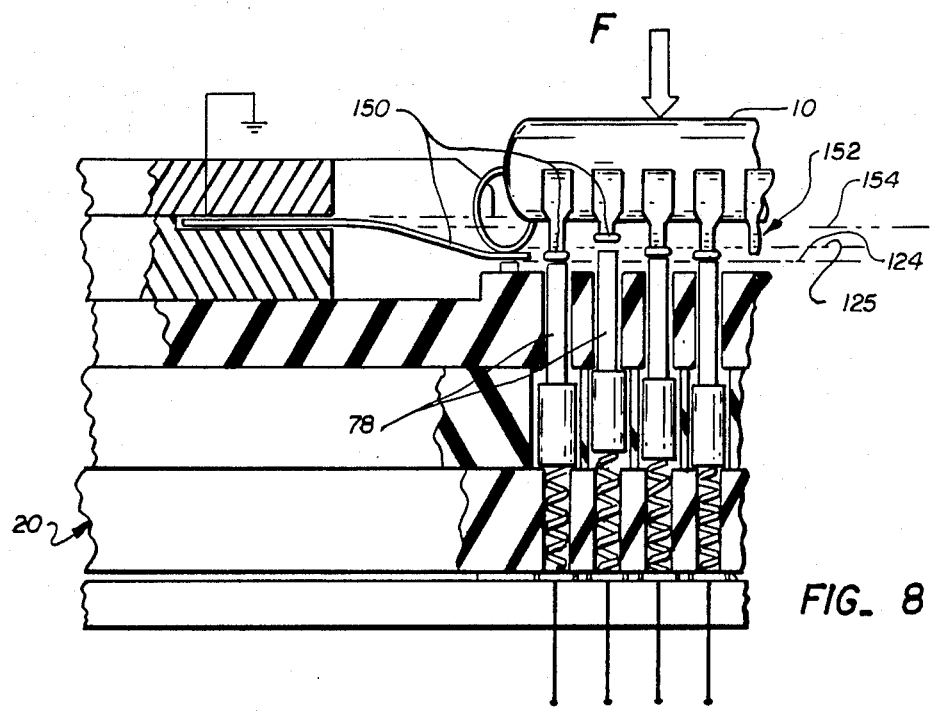
FIG. 8 is a broken partial section of an alternative socket assembly illustrating operation of the present invention.
Figure 9:
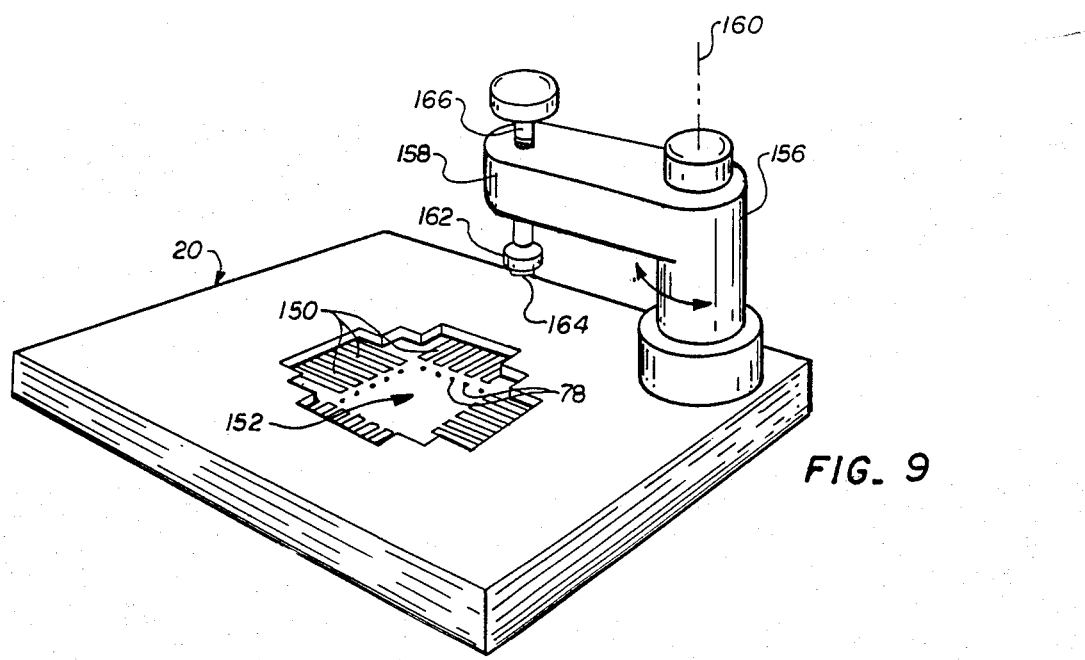
FIG. 9 is a perspective view of an alternative embodiment of a coplanarity inspection device in accordance with the present invention.

Another alternative embodiment of the present invention is depicted in FIGS. 8 and 9 wherein instead of using the side mounted wipers 110 shown in FIGS. 3 and 4, 6 and 7, a plurality of cantilevered spring fingers are disposed to extend above each of the pins 78 such that when an IC package 10 to be inspected is forced into the nest 152, the legs 12 first engage the fingers 150 and depress them into engagement with the tops of pins 78. After such engagement, the above described operation of pins 78 is accomplished with the only significant difference being that current from the inspection power supply is not caused to flow through the legs 78, and instead flows directly from pins 78 to fingers 150 and then to circuit ground.

In one embodiment, the bottoms of the cantilevered fingers (indicated by the line 154) are spaced approximated 0.010 inch above the tops of pins 78 (line 125), and the full pin vertical travel (indicated by the space between lines 124 and 125) is 0.004 inch.

One of the advantages of this embodiment is that the supply voltage is not directly applied to the legs 78 with reliance upon a good wiper contact on the side of the legs to prevent its introduction into the package under inspection. Another advantage is that the fingers 150 need not be a frangile as is required in the wiper contact embodiments previously described.

Also shown in FIG. 9 is a pivotally mounted force applying apparatus 156 which is comprised of a cantilevered arm 158 that may be rotated about the axis 160 into the rear position illustrated so as to clear the nest 152 to allow an IC package to be positioned therein. The arm 158 would then be rotated approximately 45 degrees forwardly into a detented position with the force applying head 162 disposed indirectly over the center of the IC package. The head 162 preferably has a hemispherically shaped lower protruberance 164 formed in its bottom surface to provide point contact engagement with the top of the IC package. Typically, the head 162 would be attached to the lower end of a spring loaded shaft 166 having a button 168 on its upper end to facilitate the application of finger pressure by an operator. The head 162 would normally also be normally also be spring loaded with a predetermined spring force relative to the shaft 166 so as to limit the maximum force that could be applied by the operator to a particular type of IC package.

Although the present invention has been described and illustrated in terms of certain preferred embodiments, it will be appreciated that numerous alterations and modifications thereof can be made to accommodate a wide variety of IC package configurations. The essential features of the apparatus are that a plurality of upstanding spring loaded pins be provided which are constrained to movement within a predetermined tolerance of a reference plane and that the top surfaces of the pins be positioned so as to be contacted by the normal circuit board contact portions of the legs of the device being tested. In addition, it is important that means be provided for contacting and grounding a upper portion of each leg, so as to assure that no voltage applied to a particular leg for purposes of coplanarity testing is also applied to the integrated circuit contained within the package under inspection.

It is also anticipated that instead of using the illustrated compression type springs 76, suitable leaf spring elements could be carried by either the personality board 40 or a modified version of the spring plate 42. Additionally, in place of the force applicator 26 suitable automatic device handling mechanisms could be mounted to the top of housing 16 so as to sequentially transport packaged devices from an input magazine into the nest 102 and then out of the nest 102 and into accept and reject magazines. Furthermore, suitable marking means might be incorporated to mark those devices which are rejected. For example, a marker might be included which marks those leads which are not coplanar so that in a subsequent operation the faulty leads could be adjusted to render the part usable. It is therefore intended that the appended claims be interpreted as covering all such alterations and modifications as fall within the true spirit and scope of the invention.

What is claimed is:

1. Apparatus for inspecting the coplanarity of the legs of leaded surface mounted IC components, comprising:
    means forming a plurality of electrical contact elements disposed in a geometrical array with each contact element being disposed in a position so as to contact a corresponding leg of an IC package to be inspected, each said contact element being resiliently supported and depressable a predeterminned distance in a direction normal to a reference plane defined by the contact surfaces of said contact elements when in either their rest position or their fully depressed position;
    wiper means for engaging each leg of an IC package being inspected at a point intermediate the board contact point of the leg and its point of attachment to the IC package body;and
    means for applying an electrical voltage across each contact element and a corresponding wiper means, and including an indicator for indicating current flow between a particular contact element and its corresponding wiper means through a contacting leg of the IC package under inspection, whereby when the IC package is disposed with its legs aligned with each of said contact elements and a vertical force is applied thereto tending to urge each said contacting element against its resilient support, an indication will be provided identifying each leg which fails to make contact with one of said contacting elements.

2. Apparatus for inspecting the coplanarity of the legs of leaded surface mounted IC components as recited in claim 1 and further comprising means forming a nest within which said contact elements are disposed, such nest being adapted to receive an IC package to be inspected and to cause each leg of the IC device to be aligned with one of said contact elements.

3. Apparatus for inspecting the coplanarity of the legs of leaded surface mounted IC components as recited in claim 2 wherein said wiper means are associated with said means forming said nest and include a plurality of resilient elements extending into said nest around the perimeter thereof, whereby each leg of an IC package inserted into said nest contacts one of said wiper elements.

4. Apparatus for inspecting the coplanarity of the legs of leaded surface mounted IC components as recited in claim 3 and further comprising means for applying a point loading force to the center of the top of an IC package disposed in said nest.

5. Apparatus for inspecting the coplanarity of the legs of leaded surface mounted IC components as recited in claim 4, and further comprising an elevator means disposed to extend upwardly from the center of said nest for engaging the bottom surface of an IC package disposed in said nest and operative to discharge said package from said nest after an inspection operation is completed.

6. Apparatus for inspecting the coplanarity of the legs of leaded surface mounted IC components as recited in claim 5 wherein said elevator means is resiliently biased upwardly and has an upward end configured to engage the bottom surface of the body of an IC package to be inspected and to assist in the alignment of the IC package as it is inserted into said nest.

7. Apparatus for inspecting the coplanarity of the legs of leaded surface mounted IC components as recited in claim 2 and further comprising load force applying means disposed immediately above said nest and including a spring loaded point contact member for engaging a center point of the top surface of an IC package to be inspected, and for applying a force thereto urging said package into said nest such that the legs thereof engage corresponding contact element and depress them downwardly from their upper rest position.

8. Apparatus for inspecting the coplanarity of the legs of leaded surface mounted IC components as recited in claim 7 wherein said force applying means includes a head for carrying said point contact member, and wherein said wiper means are likewise carried by said head and extend downwardly therefrom to engage the legs of an IC package to be inspected.

9. Apparatus for inspecting the coplanarity of the legs of leaded surface mounted IC components, comprising:

means forming a nest having a plurality of electrical contact elements disposed in the bottom thereof in a geometrical array with each contact element being positioned so as to lie beneath a corresponding leg of an IC package positioned in said nest for inspection, each said contact element being resiliently supported and depressable a predetermined distance in a direction normal to a reference plane defined by the contact surfaces of said contact elements when in either their rest position or their fully depressed position;

means forming resilient electrically conductive fingers disposed around the perimeter of said nest and extending into said nest with the distal end of each finger lying directly above the upper end of one of said contact elements, said fingers being engageable by the legs of the IC package and deformable into engagement with the said upper ends of said contact elements to transmit depressing forces thereto;and means for applying an electrical voltage across each contact element and a corresponding finger, and including an indicator for indicating current flow therebetween whereby when the IC package is disposed with its legs aligned with eachof said fingers and contact elements and a vertical force is applied thereto tending to urge each said finger into engagement with the top of a contacting element and to depress it against its resilient support, an indication will be provided identifying each leg which fails to cause contact between one of said fingers and its corresponding contacting element.

10. Apparatus for inspecting the coplanarity of the legs of leaded surface mounted IC components as recited in claim 9 and further comprising means for applying a point loading force to the center of the top of an IC package disposed in said nest.

11. Apparatus for inspecting the coplanarity of the legs of leaded surface mounted IC components as recited in claim 11 and further comprising load force applying means disposed immediately above said nest and including a spring loaded point contact member for engaging a center point of the top surface of an IC package to be inspected, and for applying a force thereto urging said package into said nest such that the legs thereof engage corresponding fingers and tend to depress them downwardly from their upper rest position and into engagement with a corresponding contact element.

12. Apparatus for inspecting the coplanarity of the legs of leaded surface mounted IC components as recited in claim 11 wherein said force applying means includes a pivotally mounted support arm which is rotatable between a position wherein said point contact member is disposed immediately above said nest, and a position clear of said nest.

* * * * *